United States Patent [19]

Hsu et al.

[11] Patent Number: 5,591,650

[45] Date of Patent: Jan. 7, 1997

[54] METHOD OF MAKING A BODY CONTACTED SOI MOSFET

[75] Inventors: Ching-Hsiang Hsu; Mong-Song Liang, both of Hsinchu, Taiwan

[73] Assignee: Taiwan Semiconductor Manufacturing Company Ltd., Hsin-Chu, Taiwan

[21] Appl. No.: 488,683

[22] Filed: Jun. 8, 1995

[51] Int. Cl.$^6$ .................. H01L 21/265; H01L 21/225; H01L 21/385

[52] U.S. Cl. .................. 437/21; 437/41; 437/44; 437/35; 437/164

[58] Field of Search .................. 437/21, 29, 35, 437/44, 40 AS, 40 TFI, 40 TFT, 41 AS, 41 TFI, 41 TFT, 150, 160, 164

[56] References Cited

U.S. PATENT DOCUMENTS

| | | | |
|---|---|---|---|
| 4,899,202 | 2/1990 | Blake et al. | 357/23.7 |
| 5,032,532 | 7/1991 | Mori et al. | 437/164 |
| 5,278,102 | 1/1994 | Horie | 437/228 |
| 5,279,978 | 1/1994 | See et al. | 437/21 |
| 5,298,434 | 3/1994 | Strater et al. | 437/21 |
| 5,391,508 | 2/1995 | Matsuoka et al. | 437/44 |
| 5,478,761 | 12/1995 | Komori et al. | 437/57 |
| 5,496,751 | 3/1996 | Wei et al. | 437/35 |
| 5,504,024 | 4/1996 | Hsu | 437/44 |

OTHER PUBLICATIONS

"An SOI–DRAM With Wide Operating Voltage Range By CMOS/SIMOX Technology" by R. Suma in IEEE 1994 ISSCC Slide Supplement, pp. 104–105.

*Primary Examiner*—Mary Wilczewski
*Assistant Examiner*—Brian K. Dutton
*Attorney, Agent, or Firm*—George O. Saile; Rosemary L. S. Pike

[57] ABSTRACT

A new method of forming a silicon-on-insulator device having a body node contact is dscribed. Active areas are isolated from one another within a silicon-on-insulator layer. Adjacent active areas are doped with dopants of opposite polarities to form at least one n-channel active area and at least one p-channel active area. Gate electrodes are formed over each active area. The area directly underlying the gate electrode and extending downward to the insulator layer comprises the body node. Lightly doped areas are formed beneath the spacers on the sidewalls of the gate electrodes. First ions are implanted into the active areas not covered by a mask whereby source and drain regions are formed in the at least one n-channel active area and whereby a p-channel body contact region is formed within the at least one p-channel active area wherein the p-channel body contact region contacts the p-channel body node. Second ions are implanted into the active areas not covered by a mask whereby source and drain regions are formed in the at least one p-channel active area and whereby an n-channel body contact region is formed within the at least one n-channel active area wherein the n-channel body contact region contacts the n-channel body node. The semiconductor substrate is annealed to complete formation of the silicon-on-insulator device having a body node contact in the manufacture of an integrated circuit.

23 Claims, 5 Drawing Sheets

METHOD OF MAKING A BODY CONTACTED SOI MOSFET

RELATED PATENT APPLICATION

U.S. Pat. No. 5,504,031 to the same inventors, C. H. Hsu and M. S. Liang.

BACKGROUND OF THE INVENTION

(1) Field of the Invention

The invention relates to the fabrication of integrated circuit devices, and more particularly, to a method of forming a silicon-on-insulator (SOI) device having a body node contact in the fabrication of integrated circuits.

(2) Description of the Prior Art

FIG. 1 illustrates a floating body silicon-on-insulator (SOI) MOSFET. An insulating layer 12 overlies the silicon semiconductor substrate 10. The body node 13 is formed in a silicon layer overlying the insulator layer 12 as are source and drain regions 11. The body node 13 is floating in that it is electrically isolated from the substrate by the underlying insulator layer 12. CMOS devices fabricated using the SOI structure have the advantage of process simplicity. However, to connect the body of the SOI to an external metal line requires the formation of a body connection to be different from the conventional CMOS process. In SOI devices without body contact, such as illustrated in FIG. 1, holes generated by hot electrons during high voltage operation will diffuse toward the source. As the number of holes increases, the parasitic bipolar transistor will be turned on causing additional current to flow from the source to the drain which in turn causes a "kink" effect in the drain current of the MOSFET.

U.S. Pat. Nos. 5,278,102 to Horie and 5,298,434 to Strater et al show methods to form silicon-on-insulator structures in general. "An SOI-DRAM With Wide Operating Voltage Range By CMOS/SIMOX Technology", by K. Suma in IEEE 1994 ISSCC Slide Supplement, pp. 104–105 shows SOI structures and some problems associated with them. U.S. Pat. No. 4,899,202 to Blake et al describes a silicon-on-insulator transistor with a body node to source node connection.

SUMMARY OF THE INVENTION

A principal object of the present invention is to provide an effective and very manufacturable method of forming a body node contacted silicon in the fabrication of a silicon-on-insulator integrated circuit.

Another object of the present invention is to provide a method of forming a silicon-on-insulator device having a body node contacted in the fabrication of an integrated circuit.

A further object of the present invention is to provide a method of forming a silicon-on-insulator device having a body node contacted in the fabrication of an integrated circuit wherein the width of the current flow is not reduced.

Yet another object of the invention is to provide a method of forming a silicon-on-insulator device having a body node contact formed without sacrificing drain current in the fabrication of an integrated circuit.

In accordance with the objects of this invention the method of forming a silicon-on-insulator device having a body node contact is achieved. A first silicon oxide layer is formed on the surface of a semiconductor substrate. A silicon layer is deposited over the first silicon oxide layer. Active areas within the silicon layer are isolated from one another with isolation areas. Adjacent active areas are doped with dopants of opposite polarities to form at least one n-channel active area and at least one p-channel active area. A gate oxide layer is formed over the surface of the silicon layer. A layer of polysilicon is deposited overlying the gate oxide layer and patterned to form gate electrodes over the active areas wherein in each active area, the portion of the active area directly underlying the gate electrode and extending downward to the first silicon oxide layer comprises the body node. The polysilicon layer remaining is oxidized to form a second silicon oxide layer over all surfaces of the gate electrodes. First spacers are formed on the sidewalls of the gate electrodes. Lightly doped areas are formed beneath the first spacers. A mask is formed over the at least one p-channel active area except for a portion where the body node contact will be formed. First ions are implanted into the active areas not covered by the mask whereby source and drain regions are formed in the at least one n-channel active area and whereby a p-channel body contact region is formed within the at least one p-channel active area wherein the p-channel body contact region contacts the p-channel body node. A mask is formed over the at least one n-channel active area except where the body node contact region is to be formed and is formed over the body node contact of the p-channel region. Second ions are implanted into the active areas not covered by the mask whereby source and drain regions are formed in the at least one p-channel active area and whereby an n-channel body contact region is formed within the at least one n-channel active area wherein the n-channel body contact region contacts the n-channel body node. The semiconductor substrate is annealed to complete formation of the silicon-on-insulator device having a body node contact in the manufacture of an integrated circuit.

Also in accordance with the objects of this invention, a new silicon-on-insulator body node contacted device is described. The device comprises a semiconductor substrate having an insulator layer thereover. A silicon layer overlying said insulator layer comprises isolation areas between active areas. Adjacent active areas have opposite polarities. A polysilicon gate electrode having a gate oxide thereunder and having silicon oxide sidewalls and dielectric spacers on its sidewalls overlies each active area. The portion of each active area directly underlying the gate electrode and extending downward to the insulator layer comprises the body node of the silicon-on-insulator structure. Lightly doped regions lie within the silicon layer underlying the dielectric spacers. The lightly doped regions act as extensions for the source and drain providing for the current to be collected in the area next to the body contact. Source and drain regions lie within the silicon layer on either side of the body node. A body node contact lies within a portion of the source region. Because of the source/drain extensions, the width of the device will not be affected by the presence of the body contact region.

BRIEF DESCRIPTION OF THE DRAWINGS

In the accompanying drawings forming a material part of this description, there is shown.

DESCRIPTION OF THE PREFERRED EMBODIMENTS

Figure 1:
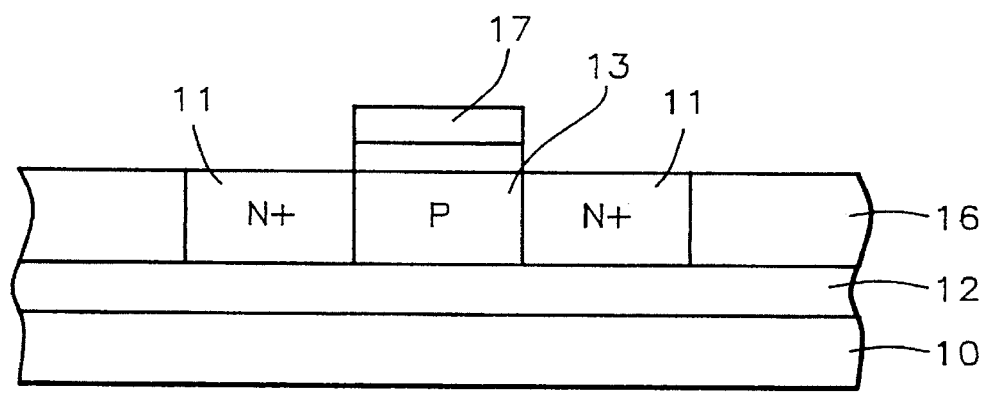
FIG. 1 schematically illustrates in cross-sectional representation a floating body silicon-on-insulator device of the prior art.
Figure 2:
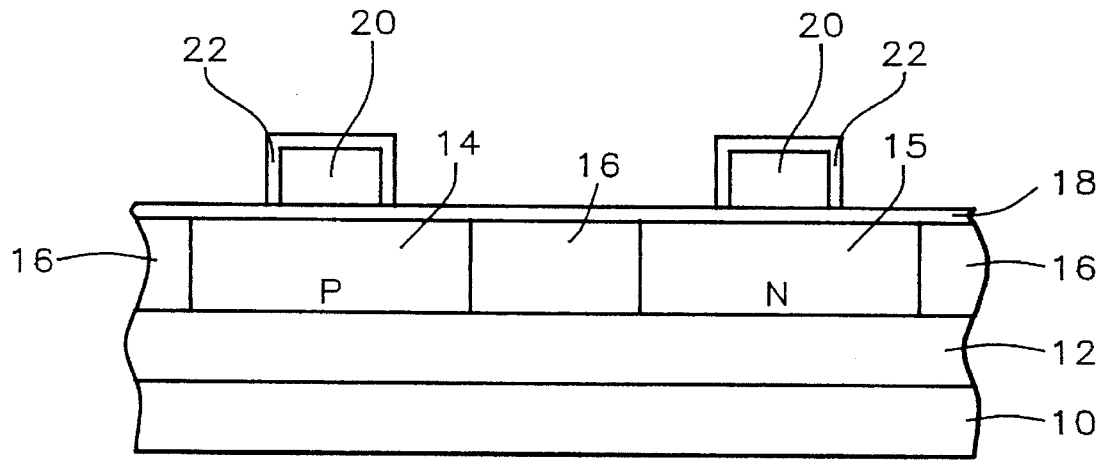
FIGS. 2, 3, 4, 5, 6, and 7 schematically illustrate in cross-sectional representation a preferred embodiment of the present invention.

Referring now more particularly to FIG. 2, there is shown an illustration of a portion of a partially completed integrated circuit in which there is a monocrystalline semiconductor substrate 10. A silicon oxide insulator layer 12 is formed over the surface of the silicon substrate to a thickness of about 3000 Angstroms. A silicon layer is deposited overlying the silicon oxide layer to a thickness of about 1500 Angstroms. Body node regions are formed within the silicon layer by ion implantation. N- and P-channel 15, respectively body node regions 14 and 15 have dopant concentrations of about $5 E 11$ atoms/cm$^2$. Active areas are isolated from one another by field oxide isolation regions 16.

A layer of gate silicon oxide 18 is deposited over the top surface of the semiconductor substrate to a thickness of between about 70 to 100 Angstroms. A layer of polysilicon is deposited by low pressure chemical vapor deposition (LPCVD) to a thickness of between about 1500 to 2500 Angstroms. The polysilicon is patterned and etched away where it is not covered by a mask forming polysilicon gate electrodes 20 in the active regions. The polysilicon is reoxidized to form silicon oxide layer 22 on all surfaces of the polysilicon gate electrodes 20.

Figure 3:
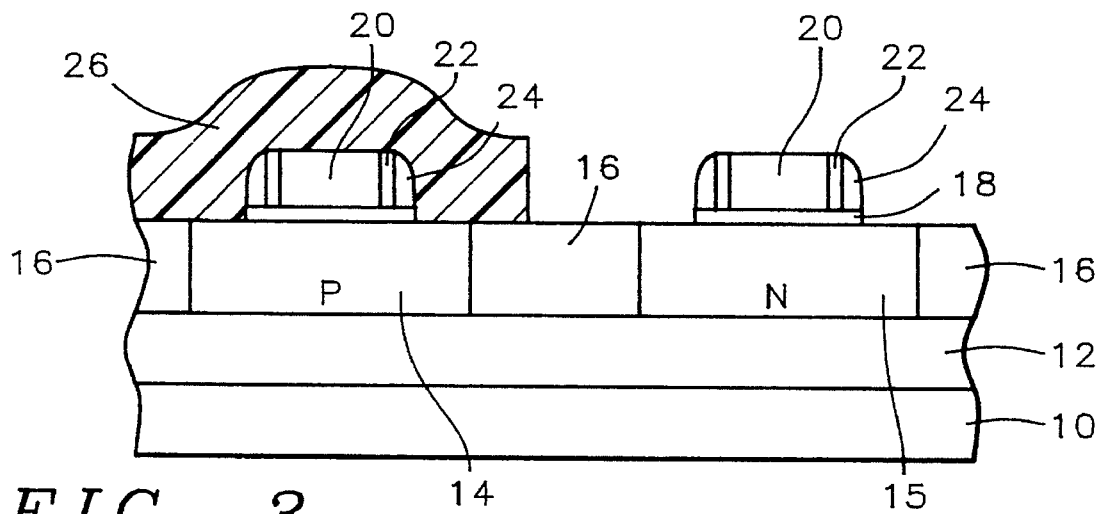

Referring now to FIG. 3, an insulating layer of phosphosilicate glass (PSG) or phosphorus doped oxide is deposited over the surface of the patterned polysilicon gate electrodes. The insulating layer is anisotropically etched leaving the insulating layer on the sidewalls of the polysilicon. The PSG sidewalls 24 are shown in FIG. 3. The anisotropic etch also etches away the oxide layer 22 on the top surface of the polysilicon lines and etches away the gate silicon oxide not covered by the gate electrodes and the PSG sidewalls.

Figure 4:
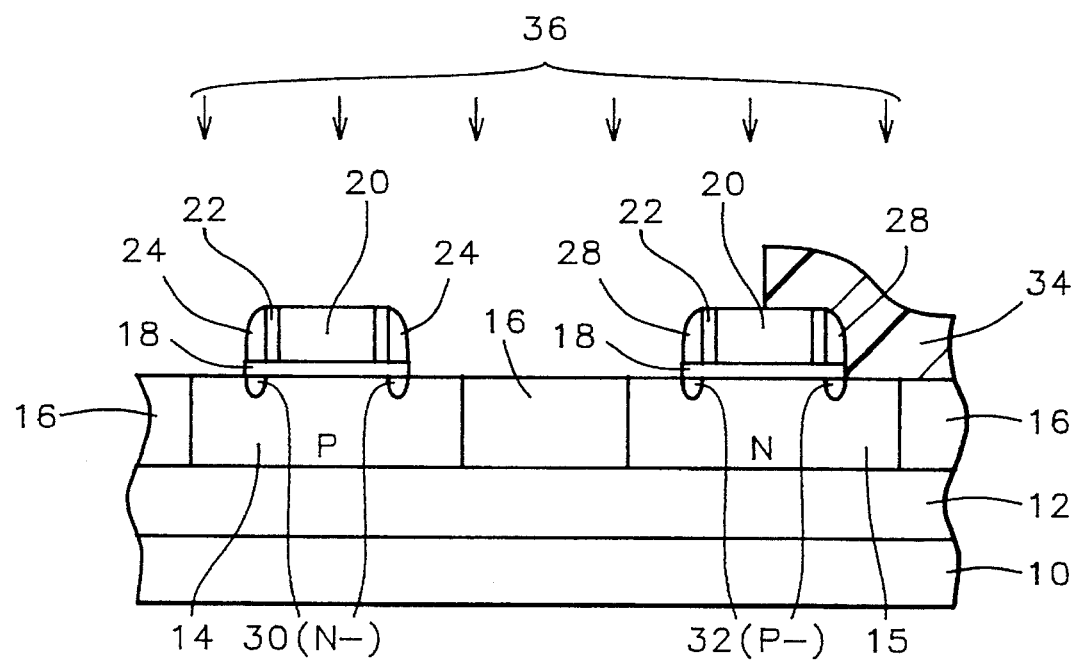

The n-channel region 14 is protected with a coating of photoresist 26. The PSG sidewalls 24 in the unprotected p-channel region 15 are etched away using a wet chemical etch. A layer of borosilicate glass (BSG) or boron doped oxide is deposited over the surface of the substrate and anisotropically etched away to leave sidewalls 28 on the gate electrode 20 in the p-channel region 15, as illustrated in FIG. 4. The mask is removed. The substrate is subjected to, for example, a rapid thermal annealing at about 1000° C. for about 15 seconds. This annealing drives in the dopants from the PSG and BSG sidewalls to form lightly doped source/drain extensions 30 and 32, respectively. Dopant concentrations of these regions are between about $1 E 18$ to $1 E 19$ atoms/cm$^3$. Alternatively, the source/drain extensions 30 and 32 could be formed by a lightly doped drain (LDD) or large tilt angle implanted drain (LATID) process.

Figure 4A:
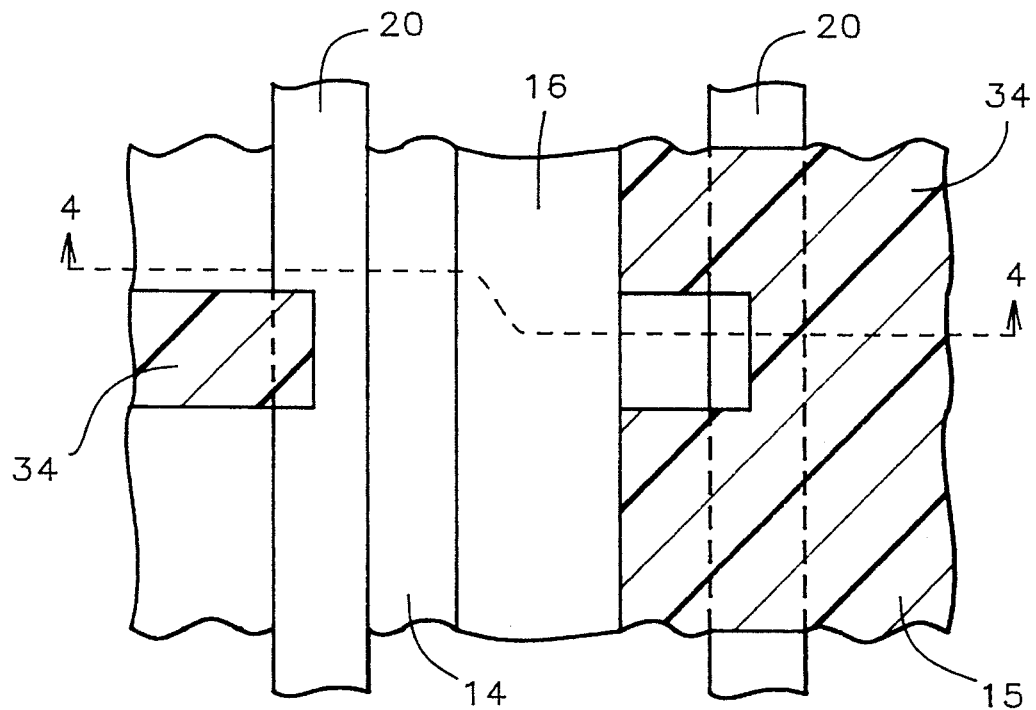
FIGS. 4A, 6A, and 8 schematically illustrate top views of a preferred embodiment of the present invention.
Figure 5:
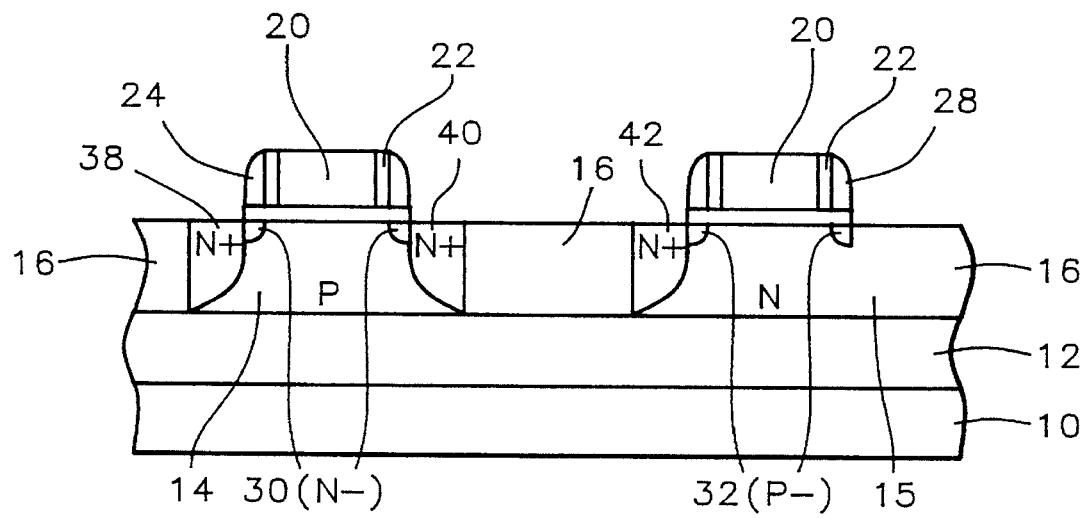

A layer of photoresist is coated over the surface of the substrate and patterned to provide a mask 34 to protect the p-channel region and a portion of the n-channel region, as illustrated in FIG. 4 and in top view in FIG. 4A. Arsenic or phosphorus ions 36 are implanted into the substrate not protected by the photoresist mask 34 to form n-channel source and drain regions 38 and 40, respectively, and p-channel body contacting region 42, as shown in FIG. 5. The ions 36 are implanted at an energy of between about 40 to 50 KeV and a dosage of between about $1 E 15$ to $1 E 16$ atoms/cm$^2$.

Figure 6:
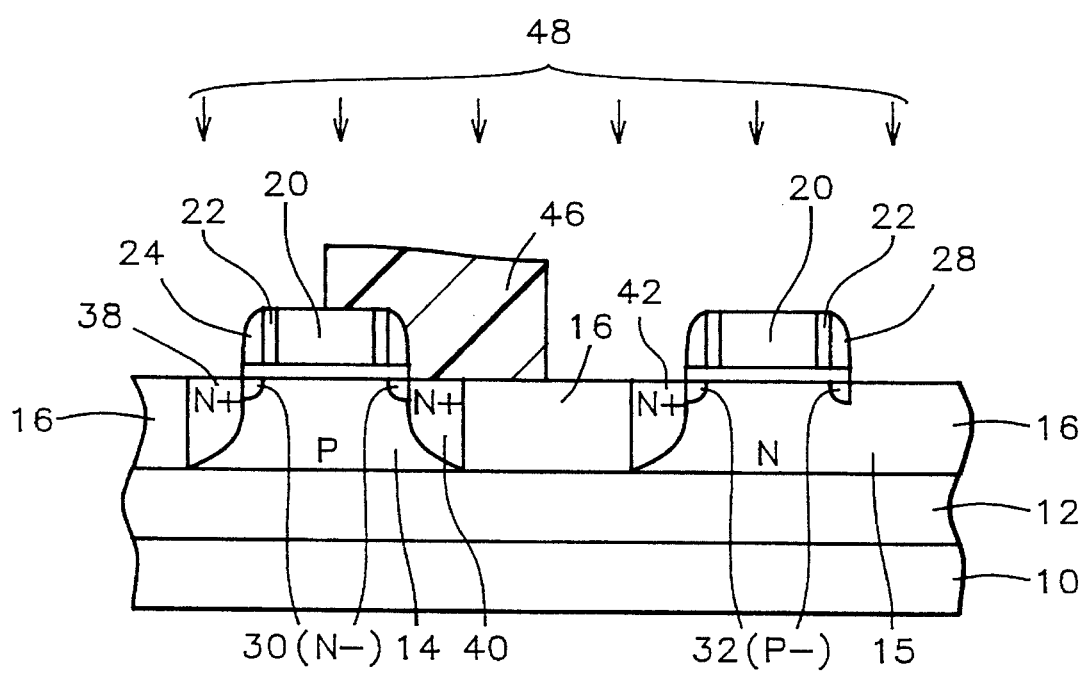
Figure 6A:
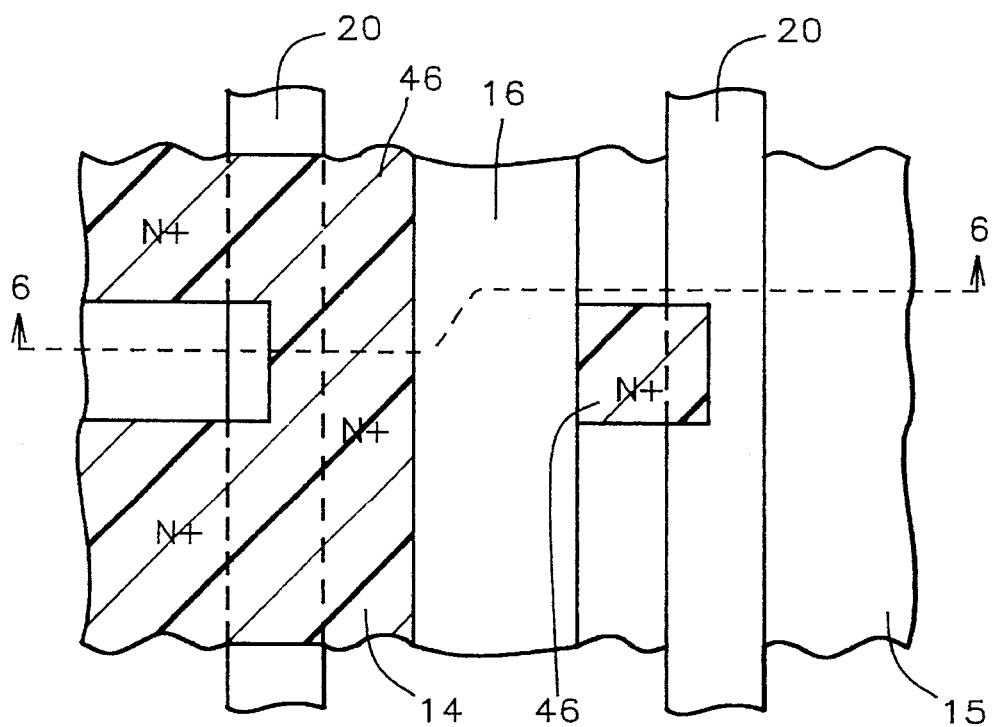
Figure 7:
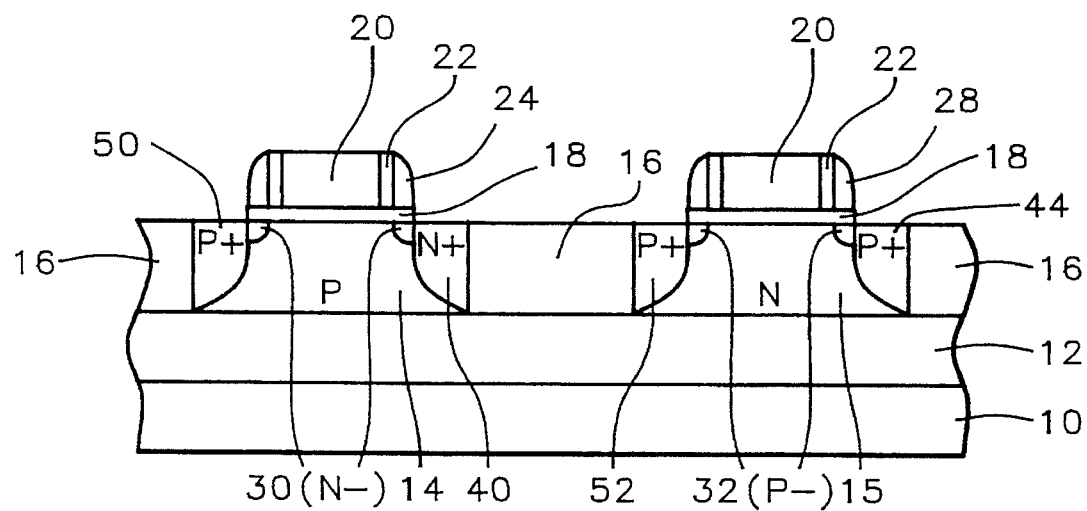

Referring now to FIG. 6, a photoresist mask 46 is formed to protect the n-channel region 14 and a portion of the p-channel region, as illustrated in top view in FIG. 6A. BF$_2$ or boron ions 48 are implanted into the substrate not protected by the photoresist mask 46 to form p-channel source and drain regions 52 and 44, respectively, and n-channel body contact region 50, as shown in FIG. 7. The ions 48 are implanted at an energy of between about 50 to 60 KeV and a dosage of between about $1 E 15$ to $1 E 16$ atoms/cm$^2$. The order of source and drain implantations may, of course, be reversed. The body contact regions 50 and 42 serve to connect the body node region to the source region.

Figure 8:
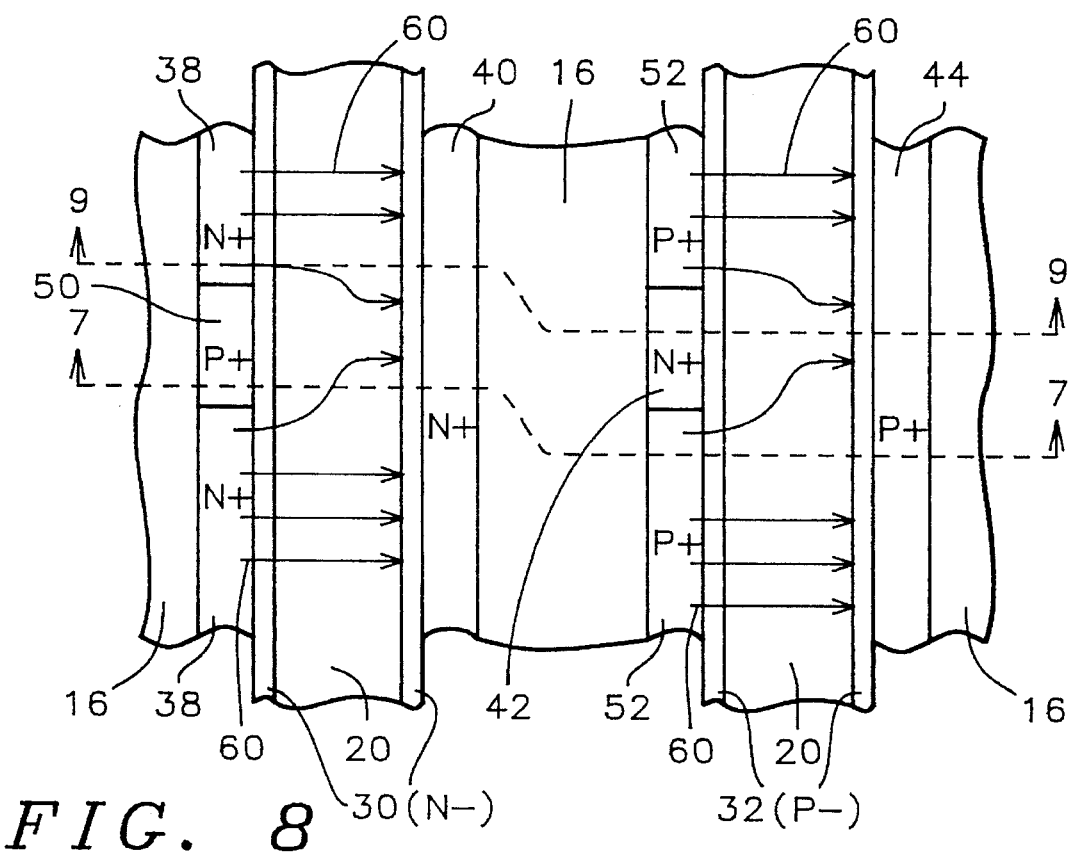
Figure 9:
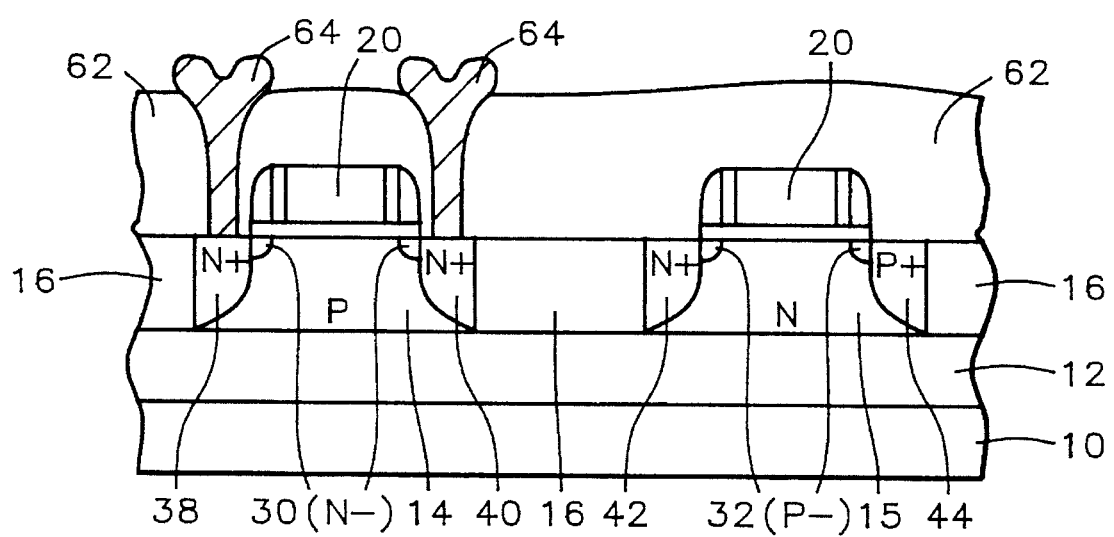
FIG. 9 schematically illustrates in cross-sectional representation a completed silicon-on-insulator body contacted device of the present invention.

FIG. 8 illustrates a top view of the n and p-channel silicon-on-insulator MOSFET after the body contact ion implant is complete. FIGS. 7 and 9 illustrate cross-sectional views 7—7 and 9—9, respectively.

The semiconductor substrate is annealed at a temperature of between about 900° to 950° C. for a duration of between about 20 to 30 minutes to remove implantation damage. Processing continues as is conventional in the art to make contact to the semiconductor devices and source and drain regions with subsequent metallurgy to complete the silicon-on-insulator integrated circuit. For example, FIG. 9 shows dielectric layer 62 overlying the gate electrodes and metal layer 64 contacting the source and drain regions in the n-channel region 14.

Referring now to FIG. 8, the arrows 60 represent the current flow from the source to the drain regions. The body contact regions 50 and 42 do not block the current flow because of the presence of the source/drain extensions 30 and 32. Therefore, the body contact is formed without sacrificing the drain current and without reducing the width of current flow.

Referring now to FIGS. 7, 8, and 9, the silicon-on-insulator body node contacted device of the present invention will be described. The device comprises a semiconductor substrate 10 having an insulator layer 12 thereover. A silicon layer overlying said insulator layer comprises isolation areas 16 between active areas 14 and 15. Adjacent active areas have opposite polarities. Active area 14 is a p-channel area and active area 15 is an n-channel area. A polysilicon gate electrode 20 having a gate oxide 18 thereunder and having silicon oxide sidewalls 22 and dielectric spacers 24 and 28 on its sidewalls overlies each active area. The portion of each active area directly underlying the gate electrode and extending downward to the insulator layer 12 comprises the body node 14 and 15 of the silicon-on-insulator structure. Lightly doped regions 30 and 32 lie within the silicon layer underlying the dielectric spacers. The lightly doped regions act as extensions for the source and drain providing for the current to be collected in the area next to the body contact. Source regions 38 and 52 and drain regions 40 and 44 lie within the silicon layer on either side of the body node. A body node contact 50 and 42 lies within a portion of the source region. Because of the source/drain extensions, the width of the device will not be affected by the presence of the body contact region. A dielectric layer 62 covers the gate electrodes. Metallurgy 64 connects to the source and drain regions of the device, as shown in FIG. 9 and elsewhere in the integrated circuit device.

While the invention has been particularly shown and described with reference to the preferred embodiments thereof, it will be understood by those skilled in the art that various changes in form and details may be made without departing from the spirit and scope of the invention.

What is claimed is:

1. The method of forming a silicon-on-insulator device having a p-channel body node and body node contact and an n-channel body node and body node contact comprising:

providing a first silicon oxide layer on the surface of a semiconductor substrate;

depositing a silicon layer over said first silicon oxide layer;

forming an n-channel active area and a p-channel active area within said silicon layer wherein said n-channel active area and said p-channel active area are isolated from one another by an isolation area;

forming a gate oxide layer over the surface of said silicon layer;

depositing a polysilicon layer overlying said gate oxide layer and patterning said polysilicon layer to form a gate electrode over each of said active areas wherein in each said active area, the portion of said active area directly underlying said gate electrode and extending downward to said first silicon oxide layer comprises said body node;

oxidizing said polysilicon layer to form a second silicon oxide layer over said gate electrodes;

forming first spacers on the sidewalls of said gate electrodes wherein said first spacers contain p-type impurities;

forming a first mask over said n-channel active area;

removing said first spacers on the sidewalls of said gate electrode in said p-channel area;

forming second spacers on the sidewalls of said gate electrode in said p-channel area wherein said second spacers contain n-type impurities;

removing said first mask;

driving in said impurities within said first and second spacers to form lightly doped areas underlying said first and second spacers within said n-channel and said p-channel active areas wherein said lightly doped areas do not extend all the way downward to said first silicon oxide layer;

forming a second mask over said p-channel active area except for a portion where said p-channel body node contact is to be formed;

implanting first ions into said active areas not covered by said second mask whereby first source and drain regions are formed in said n-channel active area and whereby said p-channel body node contact region is formed within said p-channel active area wherein said p-channel body node contact region contacts said p-channel body node;

forming a third mask over said n-channel active area except for a portion where said n-channel body node contact is to be formed and forming a third mask over said p-channel body node contact region;

implanting second ions into said active areas not covered by said third mask whereby second source and drain regions are formed in said p-channel active area and whereby said n-channel body node contact region is formed within said n-channel active area wherein said n-channel body node contact region contacts said n-channel body node; and annealing said semiconductor substrate to complete formation of said silicon-on-insulator device having said body node contact in the manufacture of an integrated circuit.

2. The method according to claim 1 wherein said first spacers comprise phosphosilicate glass.

3. The method according to claim 1 wherein said first spacers comprise phosphorus doped oxide.

4. The method according to claim 1 wherein said second spacers comprise borosilicate glass.

5. The method according to claim 1 wherein said second spacers comprise boron doped oxide.

6. The method according to claim 1 wherein said lightly doped areas form source/drain extensions.

7. The method according to claim 1 wherein said first ions are arsenic ions implanted at an energy of between about 40 to 50 KeV and a dosage of between about 1 E 15 to 1 E 16 atoms/cm$^2$.

8. The method according to claim 1 wherein said first ions are phosphorus ions implanted at an energy of between about 40 to 50 KeV and a dosage of between about 1 E 15 to 1 E 16 atoms/cm$^2$.

9. The method according to claim 1 wherein said second ions are $BF_2$ ions implanted at an energy of between about 50 to 60 KeV and a dosage of between about 1 E 15 to 1 E 16 atoms/cm$^2$.

10. The method according to claim 1 wherein said second ions are boron ions implanted at an energy of between about 50 to 60 KeV and a dosage of between about 1 E 15 to 1 E 16 atoms/cm$^2$.

11. The method according to claim 1 wherein said lightly doped areas serve as source/drain extensions and provide for the current flow between said source and drain regions so that said current flow is not blocked by said body node contact.

12. The method of forming a p-channel and n-channel silicon-on-insulator device having a body node and a body node contact wherein the current flow from source to drain is unaffected by the presence of said body node contact comprising:

providing a semiconductor substrate having an insulator layer thereover and a silicon layer overlying said insulator layer;

forming an n-channel and a p-channel active area within said silicon layer having an isolation area therebetween;

forming a gate oxide layer over the surface of said silicon layer;

depositing a polysilicon layer overlying said gate oxide layer and patterning said polysilicon layer to form a gate electrode over each of said active areas wherein in each said active area, the portion of said active area directly underlying said gate electrode and extending downward to said first silicon oxide layer comprises said body node;

oxidizing said polysilicon layer to form a second silicon oxide layer over said gate electrodes;

forming first spacers on the sidewalls of said gate electrodes wherein said first spacers contain p-type impurities;

forming a first mask over said n-channel active area;

removing said first spacers on the sidewalls of said gate electrode in said p-channel area;

forming second spacers on the sidewalls of said gate electrode in said p-channel area wherein said second spacers contain n-type impurities;

removing said first mask;

driving in said impurities within said first and second spacers to form lightly doped areas underlying said first and second spacers within said n-channel and said p-channel active areas wherein said lightly doped areas do not extend all the way downward to said insulator layer;

forming a second mask over said p-channel active area except for a portion where said p-channel body node contact is to be formed;

implanting first ions into said active areas not covered by said second mask whereby first source and drain regions are formed in said n-channel active area and whereby a p-channel body node contact region is formed within a portion of said source region within said p-channel active area wherein said p-channel body node contact region contacts said p-channel body node;

forming a third mask over said n-channel active area except for a portion where said n-channel body node contact is to be formed and forming a mask over said p-channel body node contact region;

implanting second ions into said active areas not covered by said third mask whereby second source and drain regions are formed in said p-channel active area and whereby an n-channel body node contact region is formed within a portion of said source region in said n-channel active area wherein said n-channel body node contact region contacts said n-channel body node; and annealing said semiconductor substrate to complete formation of said silicon-on-insulator device having said body node contact in the manufacture of an integrated circuit wherein said current flow from said source to said drain is unaffected by the presence of said body node contact because said lightly doped areas serve as source/drain extensions so that said current flow between said source and drain regions is not blocked by said body node contact.

13. The method according to claim 12 wherein said first spacers comprise phosphosilicate glass.

14. The method according to claim 12 wherein said first spacers comprise phosphorus doped oxide.

15. The method according to claim 12 wherein said second spacers comprise borosilicate glass.

16. The method according to claim 12 wherein said second spacers comprise boron doped oxide.

17. The method according to claim 12 wherein said first ions are arsenic ions implanted at an energy of between about 40 to 50 KeV and a dosage of between about 1 E 15 to 1 E 16 atoms/cm$^2$.

18. The method according to claim 12 wherein said first ions are phosphorus ions implanted at an energy of between about 40 to 50 KeV and a dosage of between about 1 E 15 to 1 E 16 atoms/cm$^2$.

19. The method according to claim 12 wherein said second ions are $BF_2$ ions implanted at an energy of between about 50 to 60 KeV and a dosage of between about 1 E 15 to 1 E 16 atoms/cm$^2$.

20. The method according to claim 12 wherein said second ions are boron ions implanted at an energy of between about 50 to 60 KeV and a dosage of between about 1 E 15 to 1 E 16 atoms/cm$^2$.

21. A method of forming a p-channel and n-channel silicon-on-insulator device having a body node and a body node contact wherein the current flow from source to drain is unaffected by the presence of said body node contact comprising:

providing a semiconductor substrate having an insulator layer thereover and a silicon layer overlying said insulator layer;

forming an n-channel and a p-channel active area within said silicon layer having an isolation area therebetween;

forming a gate oxide layer over the surface of said silicon layer;

depositing a polysilicon layer overlying said gate oxide layer and patterning said polysilicon layer to form a gate electrode over each of said active areas wherein in each said active area, the portion of said active area directly underlying said gate electrode and extending downward to said first silicon oxide layer comprises said body node;

oxidizing said polysilicon layer to form a second silicon oxide layer over said gate electrodes;

forming first spacers on the sidewalls of said gate electrodes wherein said first spacers contain phosphorus impurities;

forming a first mask over said n-channel active area;

removing said first spacers on the sidewalls of said gate electrode in said p-channel area;

forming second spacers on the sidewalls of said gate electrode in said p-channel area wherein said second spacers contain boron impurities;

removing said first mask;

driving in said impurities within said first and second spacers to form lightly doped areas underlying said first and second spacers within said n-channel and said p-channel active areas wherein said lightly doped areas do not extend all the way downward to said insulator layer;

forming a second mask over said p-channel active area except for a portion where said p-channel body node contact is to be formed;

implanting first ions into said active areas not covered by said second mask whereby first source and drain regions are formed in said n-channel active area and whereby a p-channel body node contact region is formed within a portion of said source region within said p-channel active area wherein said p-channel body node contact region contacts said p-channel body node;

forming a third mask over said n-channel active area except for a portion where said n-channel body node contact is to be formed and forming a mask over said p-channel body node contact region;

implanting second ions into said active areas not covered by said third mask whereby second source and drain regions are formed in said p-channel active area and whereby an n-channel body node contact region is formed within a portion of said source region in said n-channel active area wherein said n-channel body node contact region contacts said n-channel body node; and annealing said semiconductor substrate to complete formation of said silicon-on-insulator device having said body node contact in the manufacture of an integrated circuit wherein said current flow from said source to said drain is unaffected by the presence of said body node contact because said lightly doped areas serve as source/drain extensions so that said current flow between said source and drain regions is not blocked by said body node contact.

22. The method according to claim 21 wherein said first spacers comprise one of the group containing phosphosilicate glass and phosphorus doped oxide.

23. The method according to claim 21 wherein said second spacers comprise one of the group containing borosilicate glass and boron doped oxide.

* * * * *